United States Patent
Matsui et al.

(10) Patent No.: US 11,156,650 B2
(45) Date of Patent: Oct. 26, 2021

(54) STATE DETECTING SYSTEM AND STATE DETECTING METHOD

(71) Applicant: HITACHI, LTD., Tokyo (JP)

(72) Inventors: Ryohei Matsui, Tokyo (JP); Nobuyuki Sugii, Tokyo (JP); Tetsufumi Kawamura, Tokyo (JP)

(73) Assignee: HITACHI, LTD., Tokyo (JP)

( * ) Notice: Subject to any disclaimer, the term of this patent is extended or adjusted under 35 U.S.C. 154(b) by 194 days.

(21) Appl. No.: 16/446,907

(22) Filed: Jun. 20, 2019

(65) Prior Publication Data
US 2020/0033390 A1 Jan. 30, 2020

(30) Foreign Application Priority Data
Jul. 24, 2018 (JP) .............................. JP2018-138422

(51) Int. Cl.
| | | |
|---|---|---|
| *G01R 31/01* | (2020.01) | |
| *G01N 19/08* | (2006.01) | |
| *G01R 31/28* | (2006.01) | |
| *G01H 1/04* | (2006.01) | |
| *G01H 1/00* | (2006.01) | |

(52) U.S. Cl.
CPC ........... *G01R 31/016* (2013.01); *G01H 1/003* (2013.01); *G01H 1/04* (2013.01); *G01N 19/08* (2013.01); *G01R 31/2881* (2013.01)

(58) Field of Classification Search
CPC .... G01M 7/00; G01M 13/045; G01R 31/016; G01R 31/2881; G01R 31/34; G01R 31/343; G01R 31/01; G01H 1/04; G01H 1/003; G01N 19/08
See application file for complete search history.

(56) References Cited

U.S. PATENT DOCUMENTS

| | | | |
|---|---|---|---|
| 6,446,231 B1 * | 9/2002 | Inoshita | G01R 31/3004 324/523 |
| 2007/0062753 A1 * | 3/2007 | Yoshida | B60T 7/085 180/333 |
| 2014/0167810 A1 * | 6/2014 | Neti | G01R 31/34 324/765.01 |
| 2015/0134271 A1 | 5/2015 | Ikejiri et al. | |

FOREIGN PATENT DOCUMENTS

| | | |
|---|---|---|
| JP | 201594587 A | 5/2015 |
| JP | 2017219469 A | 12/2017 |

* cited by examiner

*Primary Examiner* — Lee E Rodak
*Assistant Examiner* — Brent J Andrews
(74) *Attorney, Agent, or Firm* — Miles & Stockbridge, P.C.

(57) ABSTRACT

One preferable aspect of the present invention is a state detecting system which detects a state of a machine device based on a detection signal from a detecting element provided to the machine device, and is the state detecting system which includes a non-normal time rate detecting unit which detects a rate or a value as a non-normal time rate, the rate being a rate of an integration value of a time during which an amplitude of the detection signal exceeds a predetermined normal amplitude within a predetermined time, and the value being physically equivalent to the rate.

10 Claims, 17 Drawing Sheets

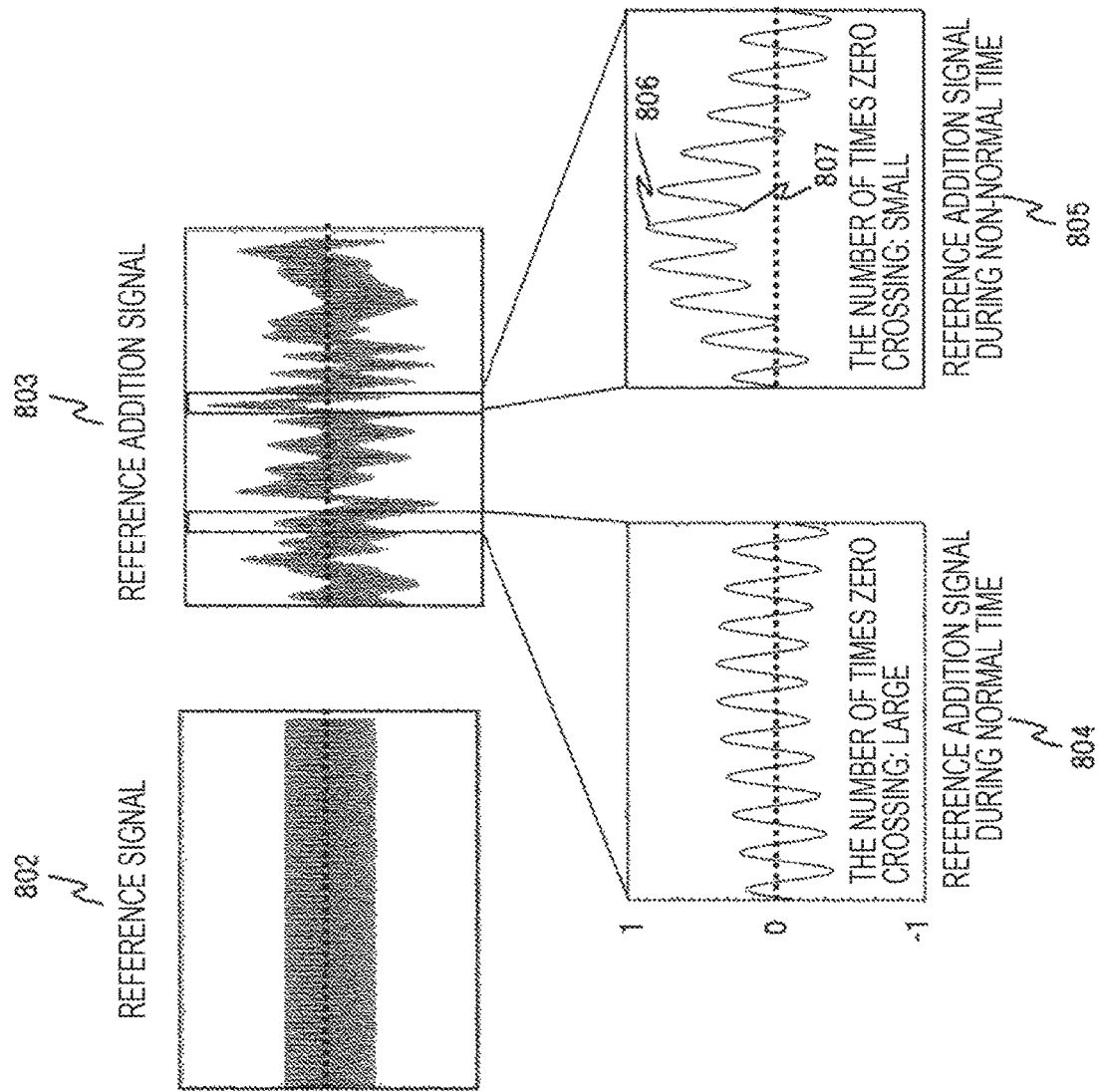
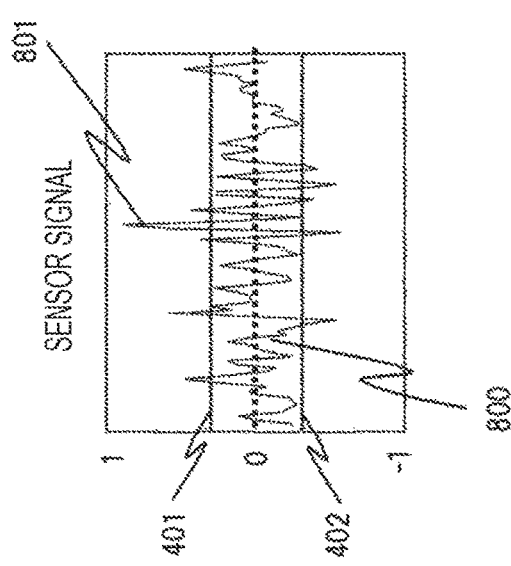

STATE DETECTING SYSTEM AND STATE DETECTING METHOD

BACKGROUND OF THE INVENTION

1. Field of the Invention

The present invention relates to a diagnosis technique which is automatically performed on a machine device, and detects a state such as deterioration of the machine device. More particularly, the present invention relates to a state detecting system and a state detecting method which detect deterioration without depending on a size and a type of the machine device and using design drawing information of the machine device.

2. Description of the Related Art

There is a technique which automatically diagnoses operation situations of various machine devices, and monitors a deterioration state such as a failure or a sign of the failure. It is concerned that a machine device is worn or damaged (referred to as "deteriorated" below) due to use during a long period of time, and therefore efficiency of the machine device lowers or a failure of the machine device and, moreover, a serious accident occur. Hence, the machine device needs to be maintained at an appropriate timing.

Cost required for the maintenance rises according to the degree of progress of a deterioration state. Maintenance cost is low at an initial period of deterioration, and maintenance cost is high at a later period of deterioration. In a case of, for example, maintenance of a rotator, initial period deterioration includes grease deterioration of a bearing. However, this state can be sufficiently maintained by grease up, and maintenance cost is cheap. On the other hand, later period deterioration includes bearing burnout, and this state needs to be maintained by overhaul and maintenance cost is high. Hence, a method for accurately monitoring a deterioration state at low cost is desired.

Although there is a method of directly inspecting a machine device by a maintenance personnel to monitor a deterioration state of the machine device, maintenance cost required for labor cost is high. Hence, a method for attaching a sensor to a machine device and monitoring a deterioration state based on analysis of a sensor signal has been conventionally adopted.

For example, JP 2015-094587 A includes receiving an input of a vibration waveform outputted from a gyro sensor installed on a main pump, performing frequency analysis on the vibration waveform, computing a frequency spectrum, computing a feature amount from the frequency spectrum, and deciding an operational life of the main pump by using the feature amount, and discloses R=a feature amount, D=a total sum of a square of an amplitude of a frequency spectrum, P=a total sum of a square of an amplitude which exceeds a first decision value, and $R=\sqrt{(P/D)}$.

For example, JP 2017-219469 A includes a vibration sensor which is fixed to a rolling bearing or a housing, a filter processing unit which divides a waveform detected by the vibration sensor into waveforms corresponding to a plurality of damage filter frequency bands to extract the divided waveforms, a computation processing unit which obtains spectrum data from the waveform after filter processing, an accurate diagnosing unit which compares a bearing damage frequency calculated based on a rotation speed of the rolling bearing and the spectrum data obtained by the computation processing unit, and specifies an abnormality site of the rolling bearing, a damage level diagnosing unit which diagnoses a damage level of the abnormality site based on a vibration effective value calculated per damage filter frequency band, and a remaining operational life predicting unit which predicts a remaining operational life of the abnormality site from the abnormality site, the damage level of the abnormality site and operation environment of a rotation part

SUMMARY OF THE INVENTION

It is demanded to accurately monitor deterioration states of various machines, devices or systems (referred to as "diagnosis targets" below) at low cost. Hence, it has been studied to attach various sensors to a diagnosis target, analyze signals obtained from the sensors, and thereby automatically monitor a deterioration state of the diagnosis target.

In this case, threshold decision based on amplitudes of sensor signals is used as a general diagnosing method. However, the amplitudes of the sensor signals differ per size and model of the diagnosis target, and therefore it is necessary to individually set a threshold per diagnosis target. An optimal threshold is determined based on a past experience and data. However, it is difficult to prepare the optimal thresholds for diverse diagnosis targets in advance.

Furthermore, a ball bearing diagnosing method widely uses spectrum analysis based on a damage frequency. However, it is necessary to obtain a design drawing of the diagnosis target in advance to calculate the damage frequency. Generally, the design drawing is not possessed by an owner of the diagnosis target. Therefore, it is necessary to make an inquiry to a device manufacturer before a detecting system starts being operated, and make a device teardown report. Cost required to obtain the design drawing is a barrier for a maintenance company which provides monitoring service to expand monitoring service business.

In view of these situations, it is desired to provide a diagnosing method which does not depend on a size and a model of a diagnosis target and does not use a design drawing of the diagnosis target.

One preferable aspect of the present invention is a state detecting system which detects a state of a machine device based on a detection signal from a detecting element provided to the machine device, and is the state detecting system which includes a non-normal time rate detecting unit which detects a rate or a value as a non-normal time rate, the rate being a rate of an integration value of a time during which an amplitude of the detection signal exceeds a predetermined normal amplitude within a predetermined time, and the value being physically equivalent to the rate.

Another preferable aspect of the present invention is a state detecting system which detects a state of a machine device, and is the state detecting system which includes: an input device which receives a rate or a value as a non-normal time rate based on a detection signal from a detecting element provided to the machine device, the rate being a rate of an integration value of a time during which an amplitude of the detection signal exceeds a predetermined normal amplitude within a predetermined time, and the value being physically equivalent to the rate; and a diagnosing unit which diagnoses deterioration of the machine device based on the non-normal time rate.

Still another preferable aspect of the present invention is a state detecting method for detecting a state of a machine device based on a detection signal obtained from a detecting element provided to the machine device, and the state detecting method is executed by an information processing device or hardware including an input device, a storage device, a processing device and an output device, and includes detecting a rate or a value as a non-normal time rate, the rate being a rate of an integration value of a time during which an amplitude of the detection signal exceeds a predetermined normal amplitude within a predetermined time, and the value being physically equivalent to the rate.

It is possible to perform diagnosis without depending on a size and a model of a diagnosis target and using a design drawing of the diagnosis target.

BRIEF DESCRIPTION OF THE DRAWINGS

FIG. 8 is a conceptual diagram illustrating a detecting method of the number of times of zero crossing according to the second embodiment;

DESCRIPTION OF THE PREFERRED EMBODIMENTS

Figure 1:
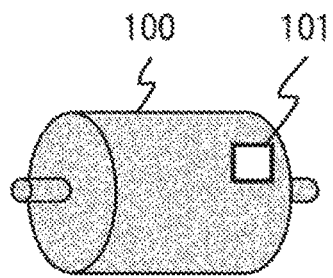
FIG. 1 is a conceptual diagram illustrating a situation that a sensor is mounted on a rotator.

Embodiments will be described in detail with reference to the drawings. However, it should not be interpreted that the present invention is limited to disclosed contents of the embodiments described below. One of ordinary skill in the art can easily understand that it is possible to change a specific configuration of the present invention without departing from the idea or the gist of the present invention.

Components having identical portions or similar functions among components of the invention described below will be assigned identical reference numerals commonly between drawings, and overlapping description will be omitted as appropriate.

When there is a plurality of elements having identical or similar functions, a plurality of elements will be described by assigning different subscripts to the identical reference numeral in some cases. In this regard, when a plurality of elements does not need to be distinguished, a plurality of elements will be described by omitting subscript in some cases.

A position, a size, a shape and a range of each component illustrated in the drawings are not illustrated as an actual position, size, shape and range in some cases for ease of understanding of the invention. Hence, the present invention is not necessarily limited to positions, sizes, shapes and ranges illustrated in the drawings.

A typical example of the embodiments described below is a state detecting system which detects a state of a diagnosis target based on a detection signal from a detecting element provided to the diagnosis target. The diagnosis target is a machine device in general. The detecting element is, for example, a known vibration sensor (acceleration sensor), and is suitable to detect a state of a portion in particular at which mechanical friction occurs. As a specific example, the detecting element can be used to detect a state of a damage/wear of a bearing portion of a motor or an engine or deterioration caused by a foreign material, and a machining state (e.g., process accuracy) of a workpiece of a cutting machine device.

The present invention includes, for example, a storage unit which, when a deterioration state of a bearing portion of a motor or an engine is detected, holds a normal amplitude calculated based on a sensor signal before deterioration, a non-normal time rate detecting unit which detects a rate of an integration value of a non-normal time during which an amplitude of a sensor signal exceeds the normal amplitude within a predetermined time, and a diagnosing unit which compares the non-normal time rate detected by the non-normal time rate detecting unit and a predetermined decision threshold, and detects the deterioration. Alternatively, according to a state detecting method for detecting a state of a diagnosis target by using an information processing device including a storage device, an input device, a processing device and an output device, the input device obtains a sensor signal from a detecting element which detects the state of the diagnosis target, and the processing device performs calculation processing of calculating a rate of an integration value of a non-normal time during which an amplitude of the sensor signal exceeds the normal amplitude within a predetermined time, and state detection processing of detecting the state based on the calculated non-normal time.

First Embodiment

The first embodiment will describe a rotator as an example of a diagnosis target, and will describe an example of a system in which a vibration sensor is attached to this rotator and which detects deterioration. A specific example of the rotator is a motor, and a specific example of the vibration sensor is a Micro Electro Mechanical System (MEMS) sensor or a piezoelectric sensor. In this regard, as described in the following embodiments, various types of diagnosis targets and sensors are applicable.

FIG. 1 is a conceptual diagram illustrating a situation that a sensor is mounted on the rotator. A vibration sensor 101 is attached to a rotator 100. An attachment portion is an arbitrary portion, and the number of attachment portions is an arbitrary number. The vibration sensor 101 may be mounted on the rotator 100 at a time of shipping or may be attached later.

Figure 2:
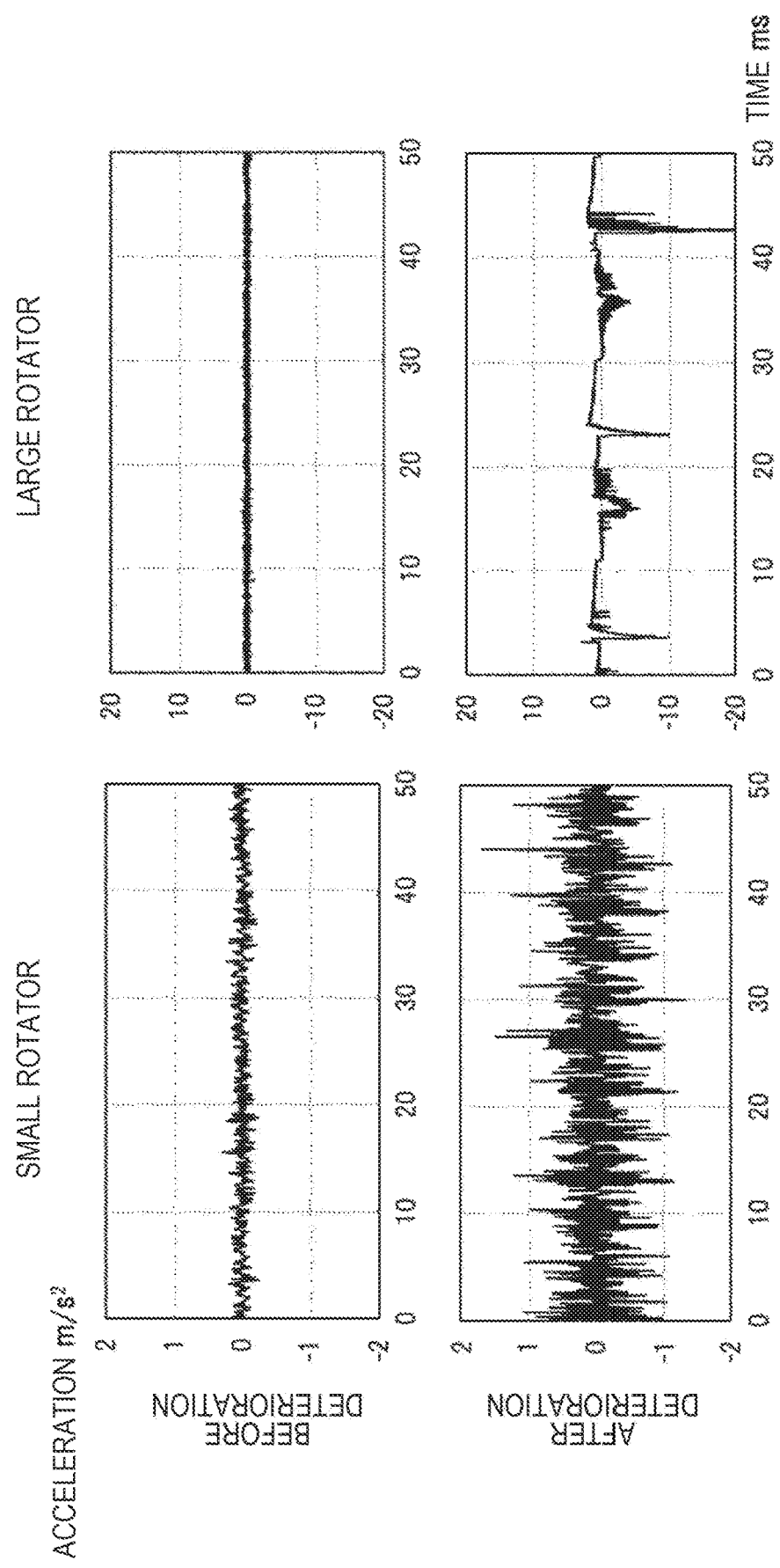
FIG. 2 is a graph chart illustrating an example of a sensor signal before and after the rotator deteriorates.

FIG. 2 is a graph chart illustrating an example of a sensor signal of the vibration sensor 101 before and after the rotator 100 deteriorates. FIG. 2 illustrates comparison between a small rotator and a large rotator, and respective horizontal axes indicate a time and respective vertical axes indicate an acceleration. It is possible to decide from the graph in FIG. 2 that deterioration of the rotator 100 increases an amplitude of the acceleration. The amplitude of the acceleration differs between the small rotator and the large rotator, and the large rotator has a higher amplitude as a whole. Hence, to detect deterioration, it is necessary to set different decision thresholds between the small rotator and the large rotator. Furthermore, it is found that a waveform pattern also differs between the small rotator and the large rotator. This is because vibration indicates a different waveform depending on a deterioration type. Frequency analysis is effective to compare waveform patterns deriving from deterioration types. However, to identify a natural damage frequency, design drawing information of the rotator is necessary.

Figure 3:
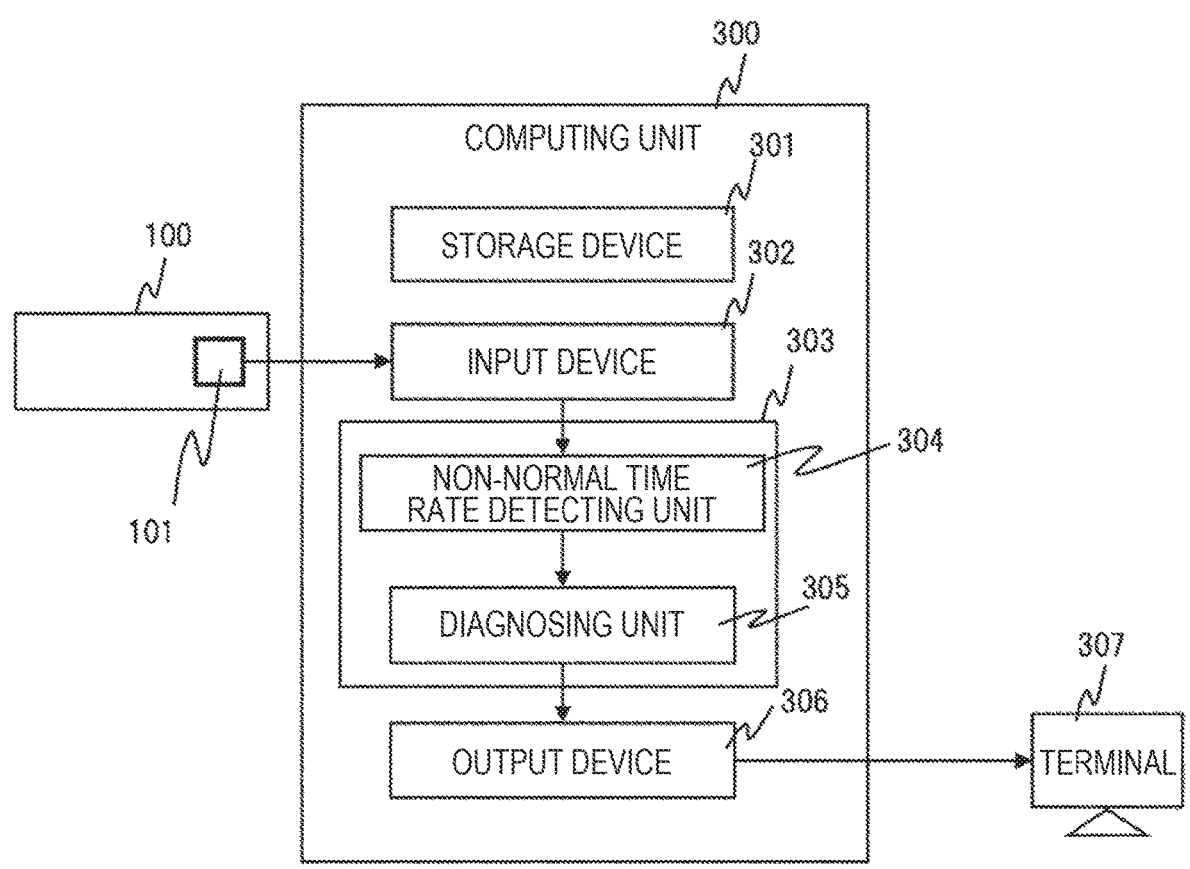
FIG. 3 is a block diagram illustrating a configuration of a deterioration detecting system.

FIG. 3 is a block diagram illustrating a configuration of a deterioration detecting system according to the first embodiment. The vibration sensor 101 is attached to the rotator 100, and a sensor signal is transmitted to a computing unit 300. The computing unit 300 can be configured as a general information processing device such as a microcomputer or a server including a storage device 301, an input device 302, a processing device (a processor or a Central Processing Unit (CPU)) 303, an output device 306 and an unillustrated bus which connects these devices.

According to the present embodiment, functions such as calculation and control are realized as predetermined processing in collaboration with other hardware when programs stored in the storage device 301 are executed by the processing device 303. Programs executed by a calculator, functions of the programs or means which realize these functions will be referred to as "functions", "means", "parts", "units" and "modules".

The processing device 303 includes a non-normal time rate detecting unit 304 and a diagnosing unit 305 as functions. The output device 306 displays a deterioration detection result on a terminal 307. At least one of the computing unit 300 and the terminal 307, and the computing unit 300 and the rotator 100 may be connected via a network.

Communication between the vibration sensor 101 and the computing unit 300 may be any one of wireless communication and wired communication. The present embodiment assumes wired communication which uses an Inter-Integrated Circuit (I2C) serial bus (trademark). In this regard, the present embodiment may assume wired communication of other standards such as Serial Peripheral Interface (SPI) (trademark) or wireless communication such as WiFi (trademark), Bluetooth (registered trademark) and ZigBee (trademark). A known configuration of an interface which is necessary for communication is included in each of the vibration sensor 101 and the input device 302.

The present embodiment assumes the one vibration sensor 101, yet may assume a plurality of sensors or other types of sensors such as temperature sensors. A plurality of sensors may transmit sensor signals to the one computing unit 300 or may transmit sensor signals to another unillustrated computing unit. The present embodiment assumes the one computing unit 300 yet may assume a plurality of computing units.

An acceleration signal detected by the vibration sensor 101 is received as an analog or digital signal by the input device 302. This acceleration signal is processed by the non-normal time rate detecting unit 304 as described later with reference to FIG. 4 to detect a non-normal time rate. Data of the non-normal time rate is sent to the diagnosing unit 305 to diagnose a device state.

Known general devices are appropriately applicable to the storage device, the input device, the processing device and the output device in this description. For example, a magnetic disk device or various semiconductor memories are applicable as the storage device. A keyboard, a mouse or various input interfaces are applicable as the input device. A display, a printer or various output interfaces are applicable as the output device.

In addition, in the above description, functions equivalent to functions configured by software can be realized by hardware such as a Field Programmable Gate Array (FPGA) and an Application Specific Integrated Circuit (ASIC), too. This aspect is also included in a scope of the present invention.

Figure 4:
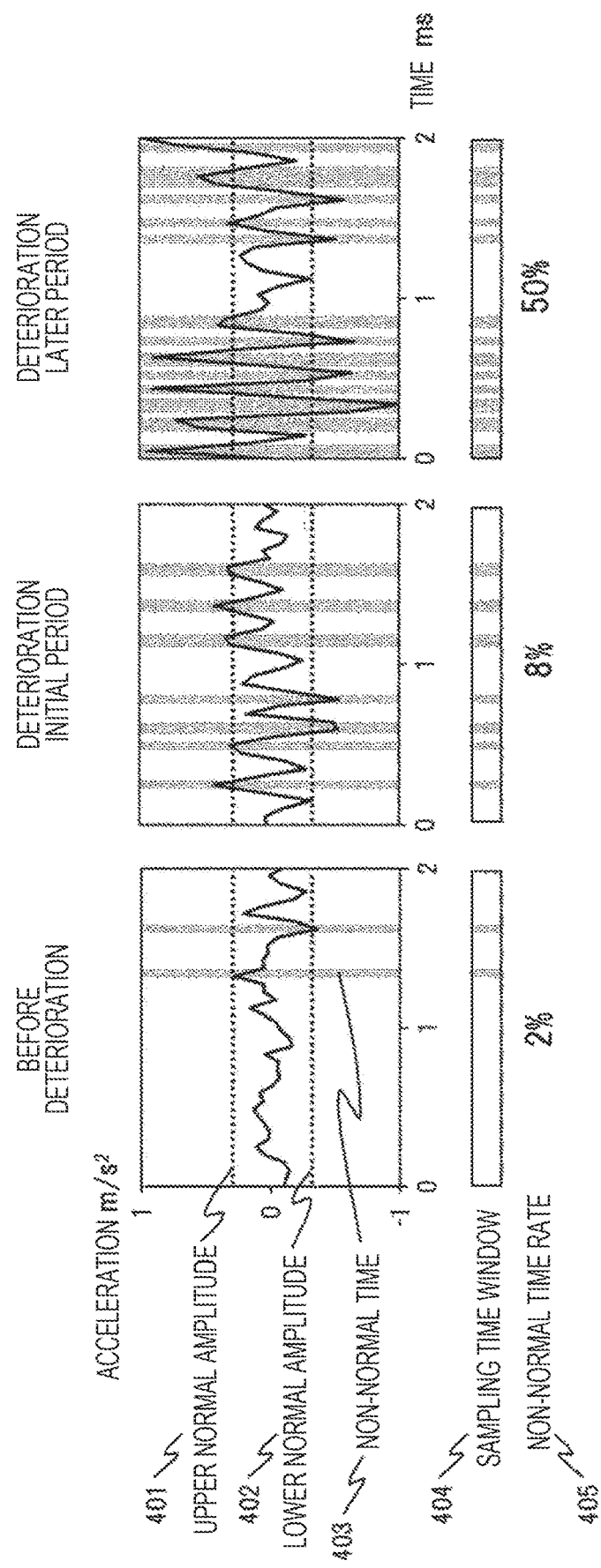
FIG. 4 is a conceptual diagram illustrating a non-normal time rate detecting method.

FIG. 4 is a conceptual diagram illustrating a non-normal time rate detecting method performed by the non-normal time rate detecting unit 304. First, a non-normal time will be described. An upper normal amplitude 401 and a lower normal amplitude 402 are set based on the amplitude of the acceleration before deterioration. A time during which the amplitude of the acceleration is higher than the upper normal amplitude 401 or a time during which the amplitude of the acceleration is lower than the lower normal amplitude 402 will be defined as a non-normal time 403. In addition, a maximum value of the acceleration is set to the upper normal amplitude 401 and the lower normal amplitude 402. However, "110% of the maximum value" may be set. Furthermore, in a case of, for example, a device which is already used to some degree in an initial state, "90% of the maximum value" may be set with a margin. The upper normal amplitude 401 and the lower normal amplitude 402 are stored as normal amplitudes in a storage device such as the storage device 301. The value of the normal amplitude is used by the non-normal time rate detecting unit 304.

Next, a non-normal time rate 405 will be described. An acceleration signal is divided by a sampling time window 404 and is handled as a subdivided signal. In the present embodiment, the sampling time window 404 is two milliseconds (ms) yet may have an arbitrary time length. A rate of an integration value of the non-normal time 403 during the period of the sampling time window 404 is defined as the non-normal time rate 405. The non-normal time rate 405 is calculated according to Equation (1).

[Mathematical Formula 1]

$$R_{over} = \frac{T_{over}}{T_s} \times 100 \qquad (1)$$

In this regard, $R_{over}$ represents a non-normal time rate (%), $T_s$ represents a sampling time window (second), and $T_{over}$ represents an integration value (second) of the non-normal time of the sampling time window.

The non-normal time rate 405 increases according to the degree of progress of a deterioration state. In FIG. 4, the non-normal time rate 405 before deterioration is 2% and low. At a deterioration initial period, the amplitude of the acceleration is high, and the non-normal time rate increases to 8%. At a deterioration later period, the amplitude of the acceleration is high, and the non-normal time rate increases to 50%. When deterioration further progresses, the non-normal time rate increases up to 100% as an upper limit.

According to the present embodiment, the non-normal time rate 405 is used as a deterioration detection index. A first advantage that the non-normal time rate is the deterioration detection index is that it is easy to set a threshold. In a case of a threshold which uses a conventional vibration amplitude as an index, the threshold needs to be adjusted according to a scale of a signal amplitude. On the other hand, the non-normal time rate is a feature amount which transitions between 0% and 100% irrespectively of the scale of the signal amplitude. When, for example, the non-normal time rate=40% is set as a threshold, this threshold is applicable to various diagnosis targets and does not need to be adjusted.

A second advantage that the non-normal time rate is the deterioration detection index is that it is possible to detect deterioration without using a measurement target design drawing. According to conventional frequency analysis which uses, for example, a damage frequency, design drawing information is necessary to calculate the damage frequency matching a deterioration type. On the other hand, the non-normal time rate is a feature amount which reflects an influence of every frequency component included in a waveform. Consequently, it is possible to detect various types of deterioration without using design drawing information.

A third advantage that the non-normal time rate is the deterioration detection index is that detection accuracy at the deterioration initial period is high. Upon comparison between the amplitude before deterioration and the amplitude at the deterioration initial period, the amplitude does not significantly change. On the other hand, the non-normal time reflects a time during which the waveform exceeds the normal amplitude even a little. Hence, the non-normal time rate is the feature amount which shows a sensitive reaction to a change in the waveform of a little amplitude, and detection accuracy at the deterioration initial period is high.

Figure 5:
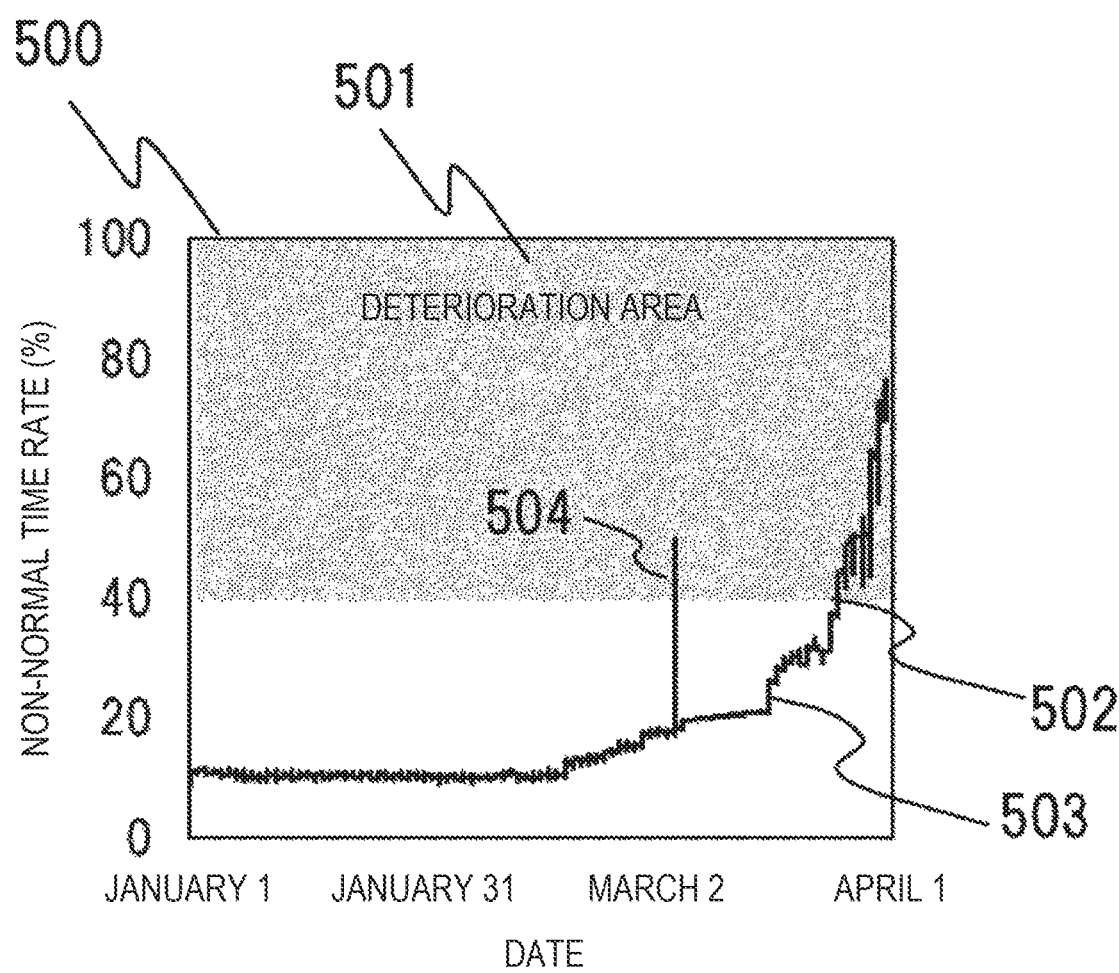
FIG. 5 is a conceptual diagram illustrating a deterioration state diagnosing scheme based on the non-normal time rate.

FIG. 5 is a conceptual diagram illustrating a deterioration state diagnosing scheme performed by the diagnosing unit 305 based on the non-normal time rate. In a non-normal time rate graph 500, a vertical axis indicates a non-normal time rate detected by the non-normal time rate detecting unit 304, and a horizontal axis indicates a date of a monitoring period. This shows that the non-normal time rate increases as the time passes. When, for example, the non-normal time rate which is 40% or more is defined as a deterioration area 501, a date subsequent to a point 502 is diagnosed as a deterioration state. The deterioration area 501 may be defined by using a constant set in advance as a decision threshold or a rapid change point in a time series such as a point 503. In this case, for example, a point of time at which there is a 10% increase within one day is used as the decision threshold.

The diagnosis result may decide whether or not deterioration occurs or may decide the degree of the deterioration state. For example, the non-normal time rate which is 40% or more may be diagnosed as the deterioration initial period, and the non-normal time rate which is 60% or more may be diagnosed as the deterioration later period. The deterioration state may be expressed qualitatively, and may be expressed quantitatively. For example, the diagnosis result may be expressed as "deterioration degree: 30".

An unexpected error such as the point 504 is detected as the non-normal time rate. When an error value is caused by a failure of a sensor or a system, it should be avoided that deterioration of a diagnosis target is diagnosed due to an error value. Hence, to exclude an unexpected error value from deterioration diagnosis, it is effective to perform deterioration diagnosis by using a moving average of the non-normal time rates. A moving average calculation formula is, for example, a method of Equation (2).

[Mathematical Formula 2]

$$a_t = a_1, a_2, \ldots \qquad (2)$$

$$A_k = \frac{\sum_{i=k}^{n} a_i}{n}$$

In this regard, $a_t$ represents a non-normal time rate at a time t, and $A_k$ represents a moving average of last n non-normal time rates at a time k. By using the moving average, an influence of the unexpected error value on the diagnosis result is reduced to 1/n times.

An example of an interface which displays a monitoring situation in a case where a device monitoring personnel (referred to as a user below) of a factory monitors a device in the factory by using this system will be described. The user can learn a situation of the device via a factory monitoring situation monitor displayed on the terminal 307. The monitor is more specifically displayed on a display of a personal computer or a display of a tablet terminal. Information to be displayed is sent to the terminal 307 via the output device 306.

Figure 6:
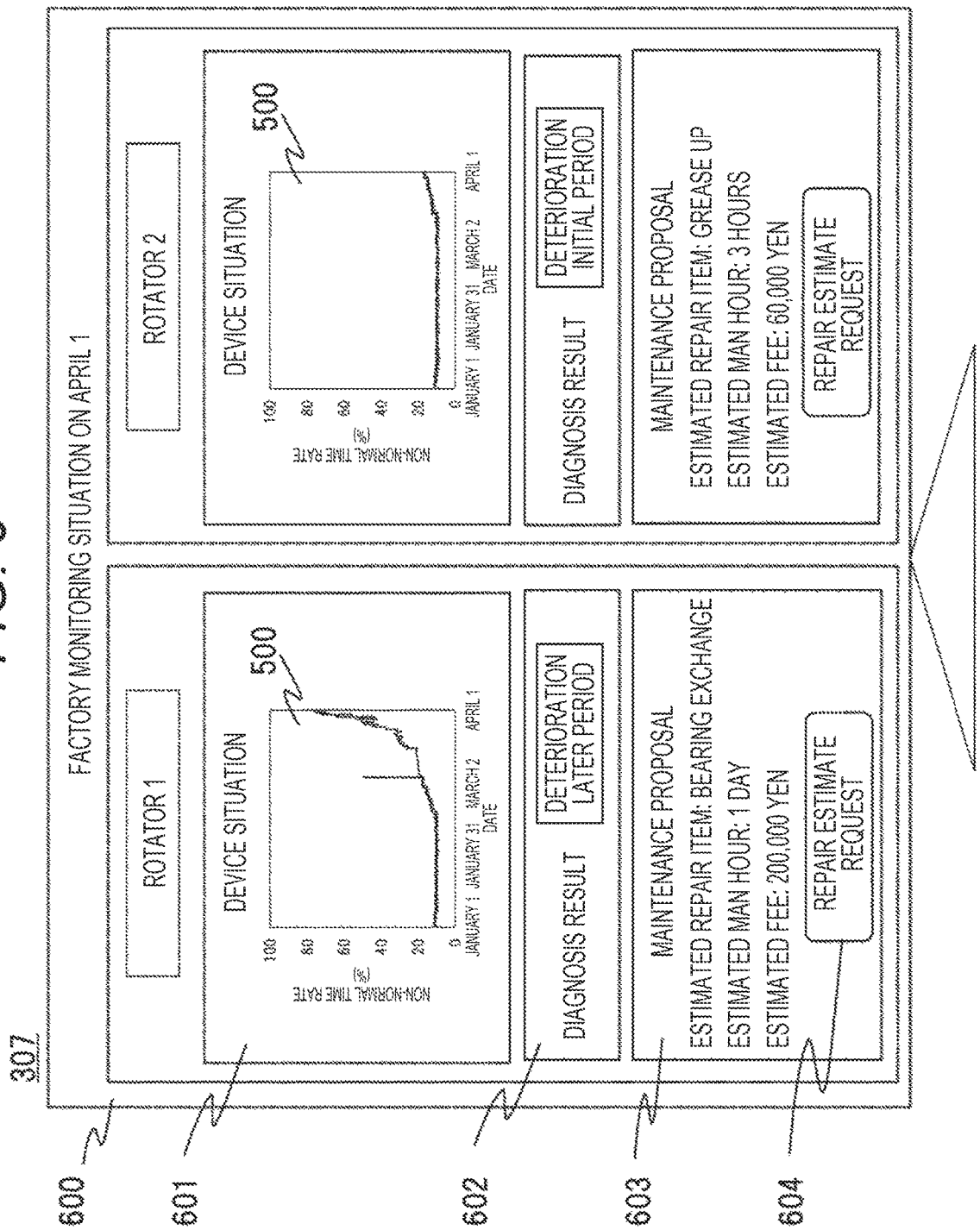
FIG. 6 is a layout chart illustrating an example of a factory monitoring situation monitor displayed on a terminal.

FIG. 6 is a layout chart illustrating an example of the factory monitoring situation monitor displayed on the terminal 307. A factory monitoring situation monitor 600 includes one or a plurality of device situation display windows 601 which displays a non-normal time rate of each device. The non-normal time rate graph 500 is displayed in the device situation display window 601, so that the user can check a deterioration situation of each device. A diagnosis result display window 602 displays a diagnosis result diagnosed by the diagnosing unit 305.

A maintenance proposal window 603 displays an optimal maintenance method according to an estimated repair item. The estimated repair item is estimated based on the diagnosis result. When a maintenance button 604 is pushed, an estimate request mail is transmitted to a maintenance company via an arbitrary network.

Second Embodiment

According to the first embodiment, a non-normal time 403 illustrated in FIG. 4 is used as a deterioration detection index. The second embodiment will describe a deterioration detecting system which uses another index (the number of times of zero crossing described below) which is physically equal to a non-normal time.

Figure 7:
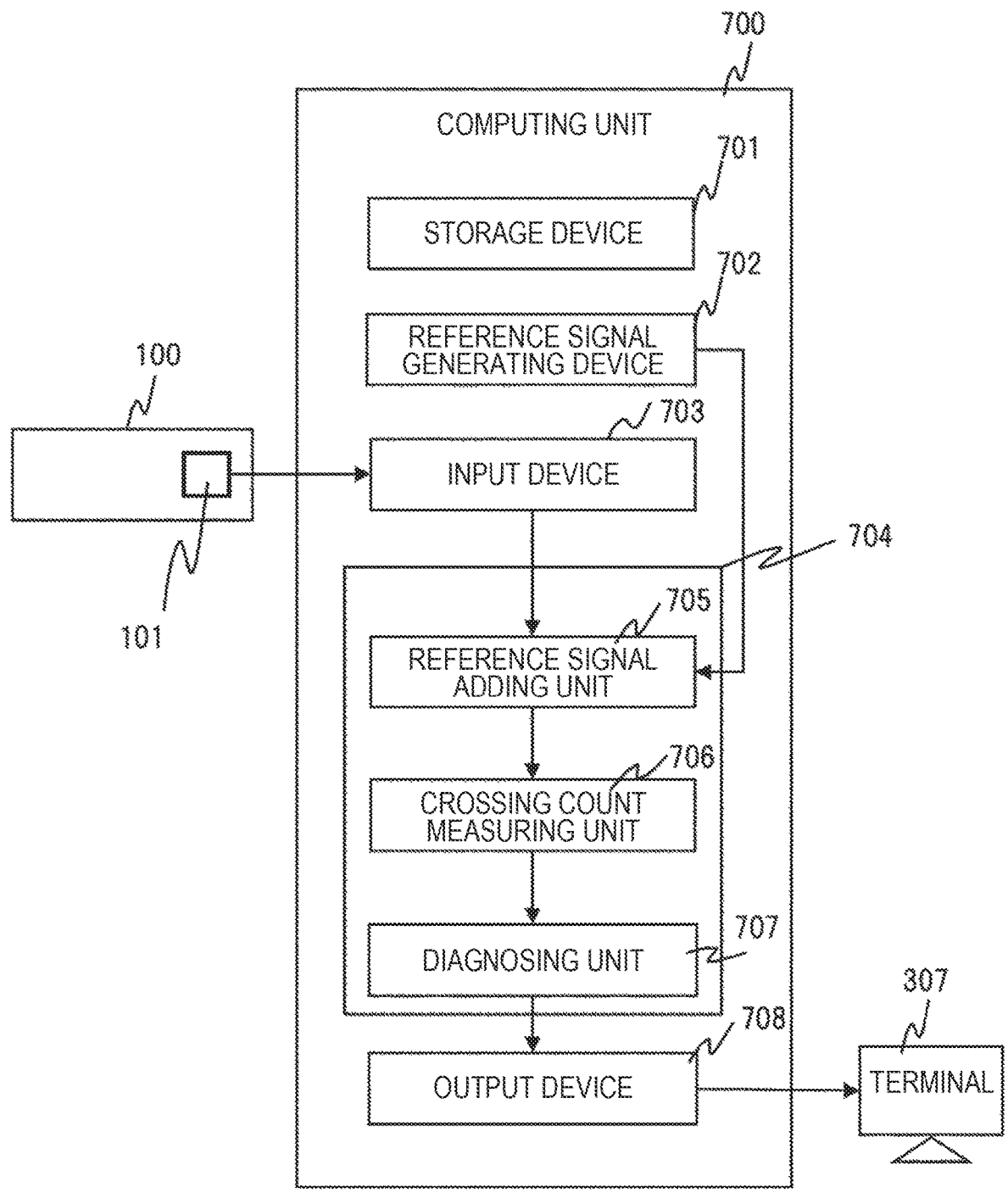
FIG. 7 is a block diagram illustrating a configuration of a deterioration detecting system according to a second embodiment.

FIG. 7 is a block diagram illustrating a configuration of the deterioration detecting system according to the second embodiment. A vibration sensor 101 is attached to a rotator 100, and a sensor signal is transmitted to a computing unit 700. The computing unit 700 can include a storage device 701, a reference signal generating device 702, an input device 703, a processing device 704 and an output device 708. The processing device 704 includes a reference signal adding unit 705, a crossing count measuring unit 706 and a diagnosing unit 707 as functions. The above can be configured similarly to the first embodiment. The reference signal generating device 702 may be mounted as hardware or may be implemented as software which is one of functions of the processing device 704. Furthermore, the reference signal adding unit 705 and the crossing count measuring unit 706 may be mounted as hardware instead of software.

FIG. 8 is a conceptual diagram illustrating a detecting method of the number of times of zero crossing performed by the reference signal adding unit 705 and the crossing count measuring unit 706. The reference signal adding unit 705 and the crossing count measuring unit 706 perform processing corresponding to that of a non-normal time rate detecting unit 304 in FIG. 3, and detect a physical amount equivalent to the non-normal time rate. The sensor signal includes a normal time 800 which does not exceed an upper normal amplitude 401 and a lower normal amplitude 402, and a non-normal time 801 which exceeds the normal amplitude. A reference signal 802 has a periodic waveform having a sufficiently higher frequency component than a frequency component included in the sensor signal. When, for example, the frequency component of the sensor signal is 10 kHz or less, a sine wave whose frequency is 50 kHz and whose amplitude is a normal amplitude can be selected as a reference signal. An arbitrary periodic waveform may be selected, yet the periodic waveform will be described as the sine wave in the present embodiment. A reference addition signal 803 has a waveform obtained by adding a reference signal to the sensor signal.

The frequency of the reference signal may be generally selected from 10 kHz to 100 kHz. More accurate diagnosis may be performed by extracting an upper limit of the frequency component included in the sensor signal and selecting the frequency which exceeds this frequency.

The reference addition signal is temporarily expanded and considered. A reference addition signal 804 during the normal time highly frequently crosses a point (referred to as a zero point below) whose amplitude is 0. The number of times (referred to as the number of times of zero crossing below) that the reference addition signal crosses a zero point per unit time is 100000 which is twice as the reference signal frequency when the sine wave whose frequency is 50 kHz is used as the reference signal. On the other hand, a reference addition signal 805 during the non-normal time less frequently crosses the zero point. This is because, during the non-normal time 801, the entire sine wave (from an upper end 806 of the sine wave to a lower end 807 of the sine wave) is lifted up, and does not cross the zero point. Hence, when the non-normal time is longer, the number of times of zero crossing decreases.

A correlation relationship between the non-normal time rate and the number of times of zero crossing will be described. When the non-normal time rate is 0%, the number of times of zero crossing is determined as a two-fold reference signal frequency. When the non-normal time rate increases, the number of times of zero crossing decreases. An increase rate of the non-normal time rate and a decrease rate of the number of times of zero crossing are equal. When, for example, the non-normal time rate increases by 30%, the number of times of zero crossing decreases by 30%. Thus, the non-normal time rate and the number of times of zero crossing have a negative correlation, and are physically equal indices.

Figure 9:
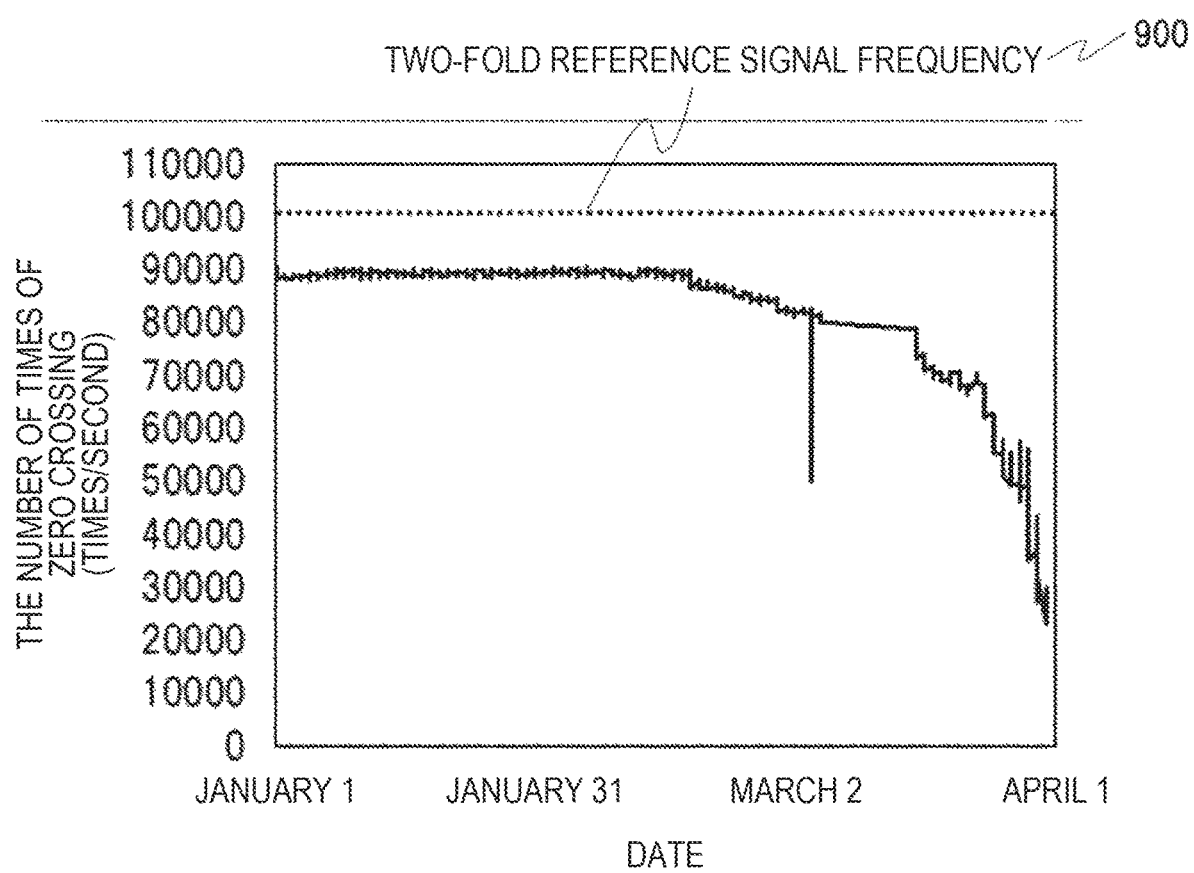
FIG. 9 is a conceptual diagram illustrating a deterioration state diagnosing scheme based on the number of times of zero crossing according to the second embodiment.

FIG. 9 is a conceptual diagram of a deterioration state diagnosing scheme which uses the number of times of zero crossing as a deterioration detection index. As a rotator deteriorates, the number of times of zero crossing decreases. At a point of time on January 1 on which the rotator does not deteriorate, the number of times of zero crossing is approximately 90000. As described above, when the non-normal time rate is 0%, the number of times of zero crossing is 100000 which is a two-fold reference signal frequency 900. Consequently, the non-normal time rate can be estimated as approximately 10% at the point of time on January 1.

An advantage that the number of times of zero crossing is a deterioration detection index is that it is easy to set a decision threshold similarly to a case where the non-normal time rate is the deterioration detection index. The number of times of zero crossing transitions between 0 and the two-fold reference signal frequency 900, and a decrease rate from the two-fold reference signal frequency 900 and the non-normal time rate are equal. Hence, when the non-normal time rate=$T_{th}$ (%) is a decision criterion, the non-normal time rate can be converted into the decision threshold of the number of times of zero crossing according to Equation (3).

[Mathematical Formula 3]

$$Z_{th} = Z_{max}\left(\frac{100 - T_{th}}{100}\right) \qquad (3)$$

In this regard, $Z_{th}$ represents a decision threshold (times/second) of the number of times of zero crossing, and $Z_{max}$ represents the two-fold reference signal frequency 900. In a case of, for example, $T_{th}$=40(%), $Z_{th}$=60000 (times/second) can be set.

A second advantage that the number of times of zero crossing is the deterioration detection index is that it is easy to improve an index resolution. According to deterioration diagnosis which uses a conventional vibration amplitude as an index, it is necessary to improve a resolution of an analog/digital converter which converts a sensor signal into a digital value to improve an index resolution, yet is not easy to improve the resolution from a viewpoint of mounting.

In FIG. 9, the number of times of zero crossing decreases from approximately 90000 before deterioration (January 1) to approximately 30000 after deterioration (April 1), and a difference is approximately 60000. In addition, when the reference signal frequency is increased by one digit from 50 kHz to 500 kHz, the two-fold reference signal frequency 900 increases by one digit to 1000000 times. In this case, the difference before and after deterioration similarly increases by one digit to approximately 600000. As a result, this corresponds to one-digit improvement of the resolution of the number of times of zero crossing. By changing the reference signal frequency in this way, it is possible to easily improve the resolution of the number of times of zero crossing.

Figure 10:
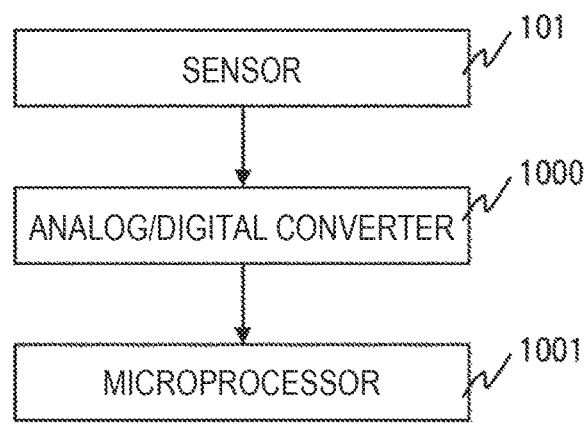
FIG. 10 is a block diagram illustrating a hardware configuration according to the second embodiment.

FIG. 10 is a block diagram illustrating a hardware configuration which measures the number of times of zero crossing. The sensor signal outputted from the vibration sensor 101 is an analog voltage. An analog/digital converter 1000 converts the analog voltage into a digital value and inputs the digital value to a microprocessor 1001. The microprocessor 1001 adds the reference signal to the digital value, generates the reference addition signal, counts the number of times that the reference addition signal crosses a zero point per unit time, and thereby measures the number of times of zero crossing.

In addition, the analog/digital converter 1000 may be configured as hardware or may be realized when the microprocessor 1001 executes software. Upon comparison with a configuration in FIG. 7, the analog/digital converter 1000 is disposed at a later stage of the input device 703, and the microprocessor 1001 corresponds to the processing device 704. In addition, the number of times that the reference addition signal crosses a zero level has been measured. However, when the reference addition signal during a normal time (during a reference time) shifts toward a plus side or a minus side, the zero level may be shifted and corrected toward the plus side or the minus side accordingly. That is, the zero level and a concept of positive and negative are relative.

Third Embodiment

The second embodiment has described a block diagram of a hardware configuration where a microprocessor measures the number of times of zero crossing with reference to FIG. 10. The third embodiment will describe an embodiment of a hardware configuration which measures the number of times of zero crossing without using a microprocessor with reference to FIG. 11.

Figure 11:
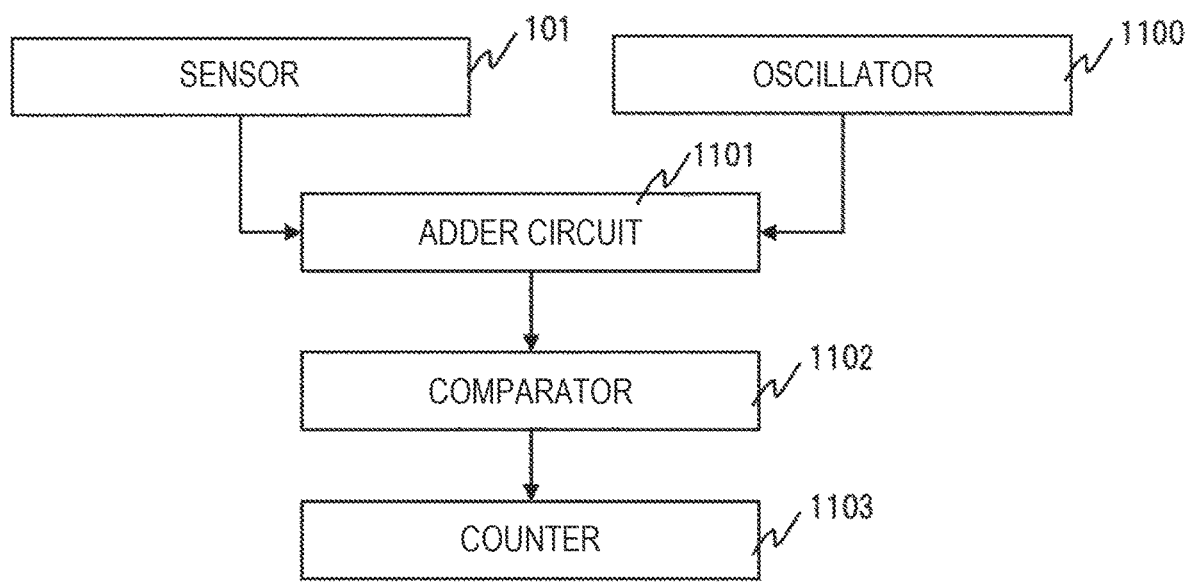
FIG. 11 is a block diagram illustrating a hardware configuration which does not use a microprocessor according to a third embodiment.

FIG. 11 is a block diagram illustrating the hardware configuration which measures the number of times of zero crossing without using the microprocessor. An oscillator 1100 generates a reference signal 802 in FIG. 8. An adder circuit 1101 adds a sensor signal outputted from a vibration sensor 101 and a reference signal outputted from the oscillator 1100, and generates a reference addition signal. A comparator 1102 outputs 1 when the reference addition signal is a positive value, and outputs 0 when the reference addition signal is a negative value. A counter 1103 measures the number of times that an output value of the comparator transitions between 1 and 0 per unit time. An output of the counter 1103 is the number of times of zero crossing.

Upon comparison between the hardware configuration (FIG. 10) according to the second embodiment and the hardware configuration (FIG. 11) according to the third embodiment, the third embodiment can suppress power consumption of the overall hardware more. According to the second embodiment, an analog/digital converter 1000 is required to have a higher specification (a higher resolution and a higher sampling rate). Generally, power consumption of high-performance analog/digital converter is high, and therefore the power consumption of the overall hardware is higher in the second embodiment. On the other hand, in the third embodiment, the number of times of zero crossing is measured without converting the sensor signal into a digital value. Hardware (the oscillator 1100, the adder circuit 1101, the comparator 1102 and the counter 1103) which processes analog signals can be driven with low power consumption, so that the power consumption of the overall hardware is low in the third embodiment.

Upon comparison with the configuration in FIG. 7, the configuration in FIG. 11 makes it possible to replace a reference signal adding unit 705 and a crossing count measuring unit 706 configured as a processor.

Fourth Embodiment

In the second embodiment and the third embodiment, the number of times of zero crossing is used as another index which is physically equal to a non-normal time 403 illustrated in FIG. 4. In the fourth embodiment, a capacitor charging voltage is used as another index which is physically equal to the non-normal time 403.

Figure 12:
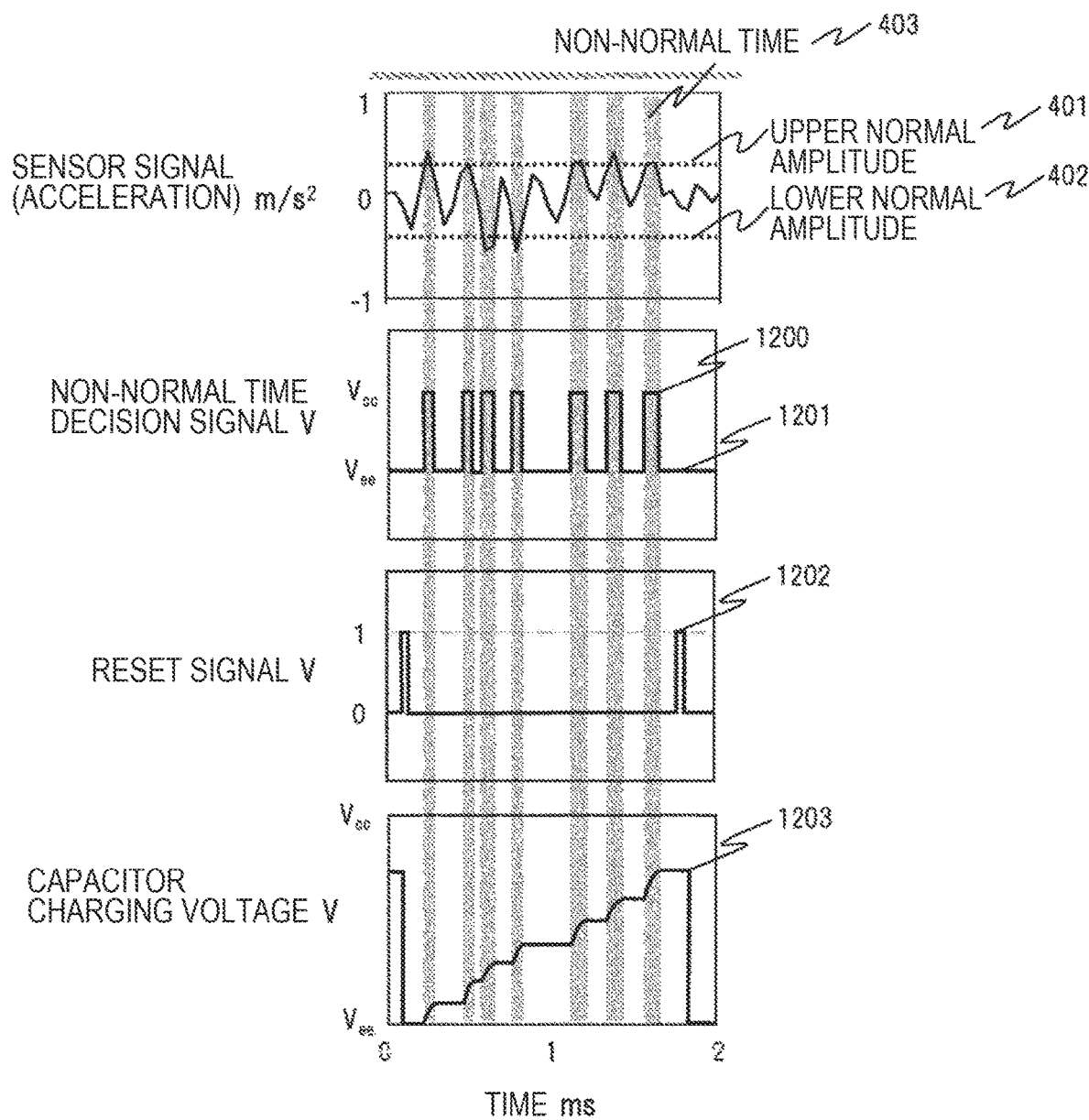
FIG. 12 is a conceptual diagram illustrating a capacitor charging voltage detecting method according to a fourth embodiment.

FIG. 12 is a conceptual diagram illustrating a capacitor charging voltage detecting method. A sensor signal includes the non-normal time 403 which exceeds an upper normal amplitude 401 and a lower normal amplitude 402. A non-normal time decision signal outputs a HIGH voltage 1200 during the non-normal time 403 and outputs a LOW voltage 1201 during a normal time. Assuming the voltage during mounting, FIG. 12 illustrates a HIGH voltage=Vcc and a LOW voltage=Vee. A reset signal outputs a reset voltage 1202 at an interval of a sampling time window 404 in FIG. 4. Only when the non-normal time decision signal is the HIGH voltage, the capacitor is charged, and the capacitor charging voltage increases. At a timing 1203 at which the reset signal is inputted, all electrical charges of the capacitor are discharged, and the capacitor charging voltage returns to 0. The capacitor charging voltage increases in proportion to a rate of a time which the HIGH voltage occupies in the sampling time window 404, and therefore is an index which is physically equal to the non-normal time rate.

When a time constant relative to capacitor charging is small, the capacitor is fully charged at an instant at which the non-normal time decision signal becomes the HIGH voltage. Hence, a sufficiently large value is selected as the time constant relative to capacitor charging such that, even when charging continues during the sampling time window, the capacitor is not fully charged. More specifically, a series resistor is inserted in a charging path of the capacitor to increase a time constant determined based on a product of a resistance value and capacitance of the capacitor.

Figure 13:
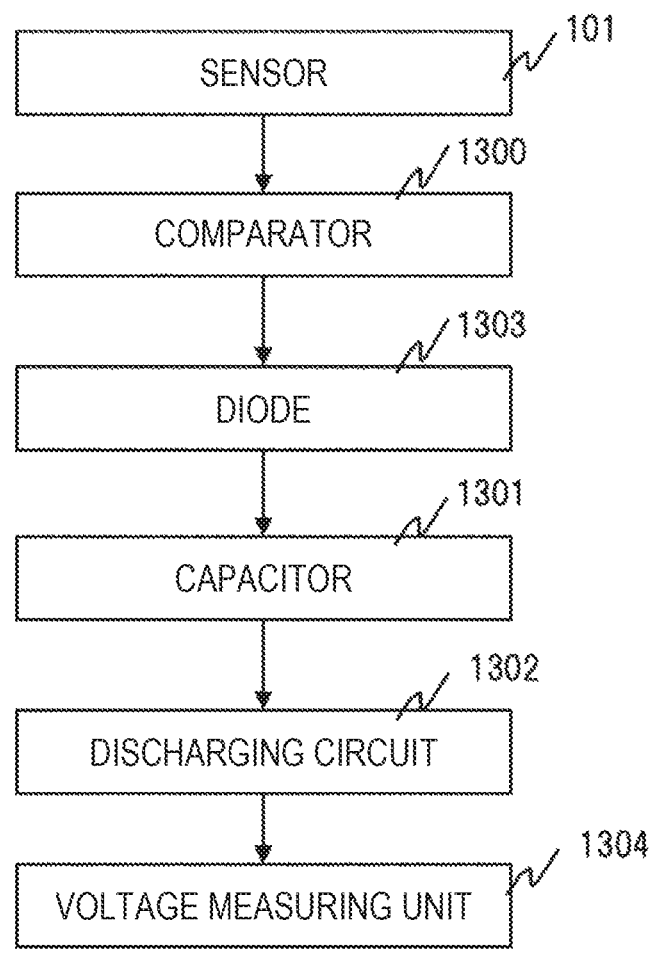
FIG. 13 is a block diagram illustrating a hardware configuration according to the fourth embodiment.

FIG. 13 is a block diagram illustrating a hardware configuration which measures the capacitor charging voltage. A vibration sensor 101 outputs a sensor signal to a comparator 1300. The comparator 1300 outputs a non-normal time decision signal. That is, the comparator 1300 outputs the HIGH voltage when the sensor signal exceeds a normal amplitude, and outputs the LOW voltage when the sensor signal does not exceed the normal amplitude. An output of the comparator 1300 is inputted to a capacitor 1301 via a diode 1303, and charges the capacitor 1301. When receiving a reset instruction from an unillustrated reset circuit, a discharge circuit 1302 discharges electrical charges charged to the capacitor 1301. Rectification is performed by the diode 1303 such that charged electrical charges are not backflow-discharged at a timing other than a reset timing. The discharged voltage is measured by a voltage measuring unit 1304.

In a time zone in which the capacitor discharges after resetting, an input of the comparator 1300 cannot be accepted. However, by setting a sufficiently short time required for discharging compared to the sampling time window 404, the time can be reduced to such a degree that an influence on the non-normal time rate can be substantially ignored. There can be also employed an aspect where two sets of circuits in FIG. 13 are provided and alternately used.

Upon comparison with the configuration in FIG. 7, a configuration in FIG. 13 makes it possible to replace a reference signal adding unit 705 and a crossing count measuring unit 706 configured as a processor, and perform processing equivalent to that of a non-normal time rate detecting unit 304 in FIG. 3.

Figure 14:
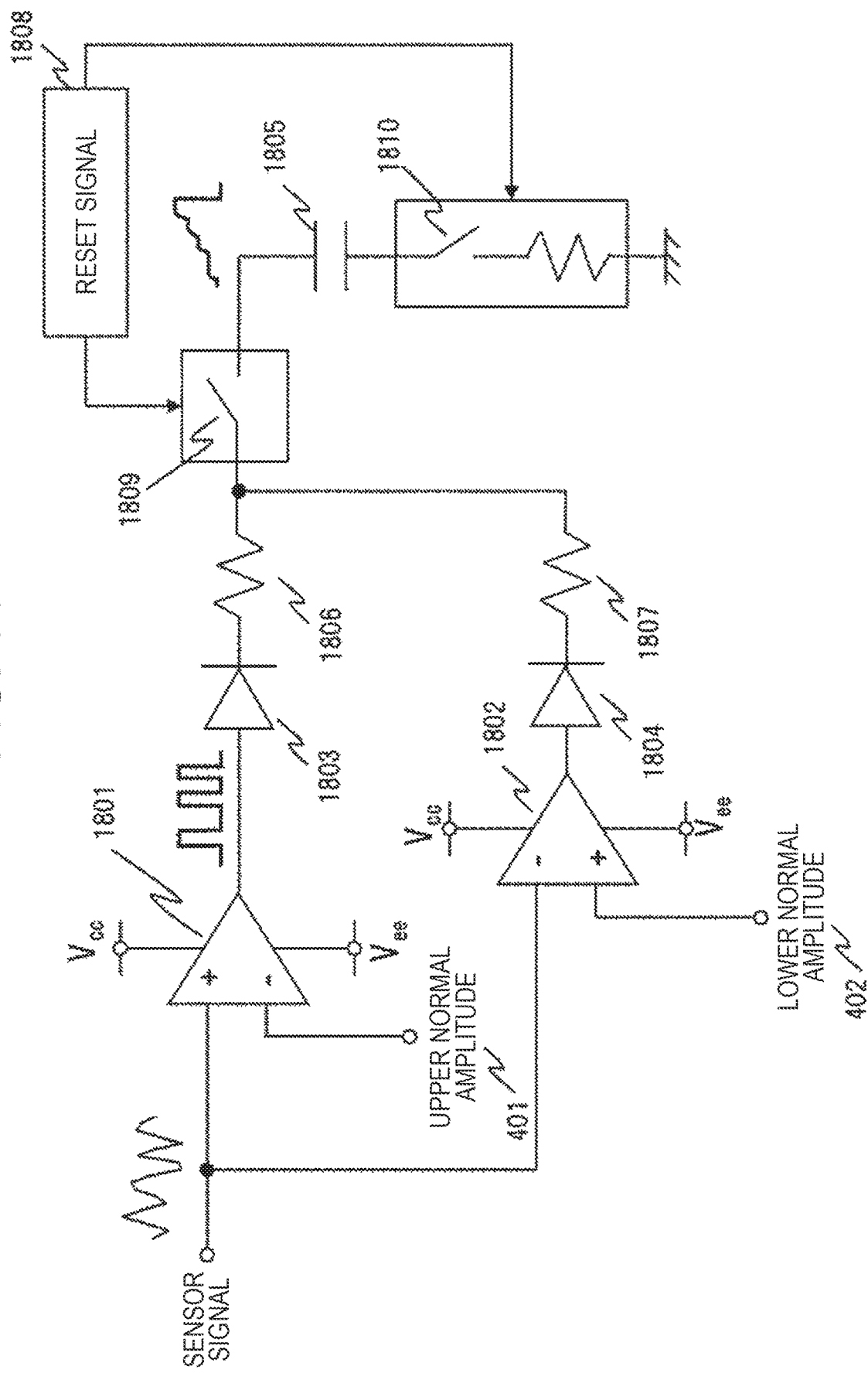
FIG. 14 is a circuit diagram which realizes the fourth embodiment.

FIG. 14 illustrates one example of a circuit diagram which realizes the present embodiment, and is a specific example of a block diagram in FIG. 13. An operational amplifier 1801 functions as a comparator, and outputs Vee when the sensor signal is higher than the upper normal amplitude 401 and outputs Vcc when the sensor signal is lower than the upper normal amplitude. An operational amplifier 1802 functions as a comparator likewise, and outputs Vee when the sensor signal is lower than the lower normal amplitude 402 and outputs Vcc when the sensor signal is higher than the lower normal amplitude.

Output voltages of the operational amplifier 1801 and the operational amplifier 1802 are rectified by a diode 1803 and a diode 1804, and stores power in a capacitor 1805. The time constant relative to power storage is determined by the capacitor 1805 and constants of a resistor 1806 and a resistor 1807. A reset signal 1808 is inputted at an interval of the sampling time window 404, operates a switch 1809 and a switch 1810, and discharges a capacitor voltage. The switch 1809 is ON and the switch 1810 is OFF during power storage, and the switch 1809 is OFF and the switch 1810 is ON during discharging.

Figure 15:
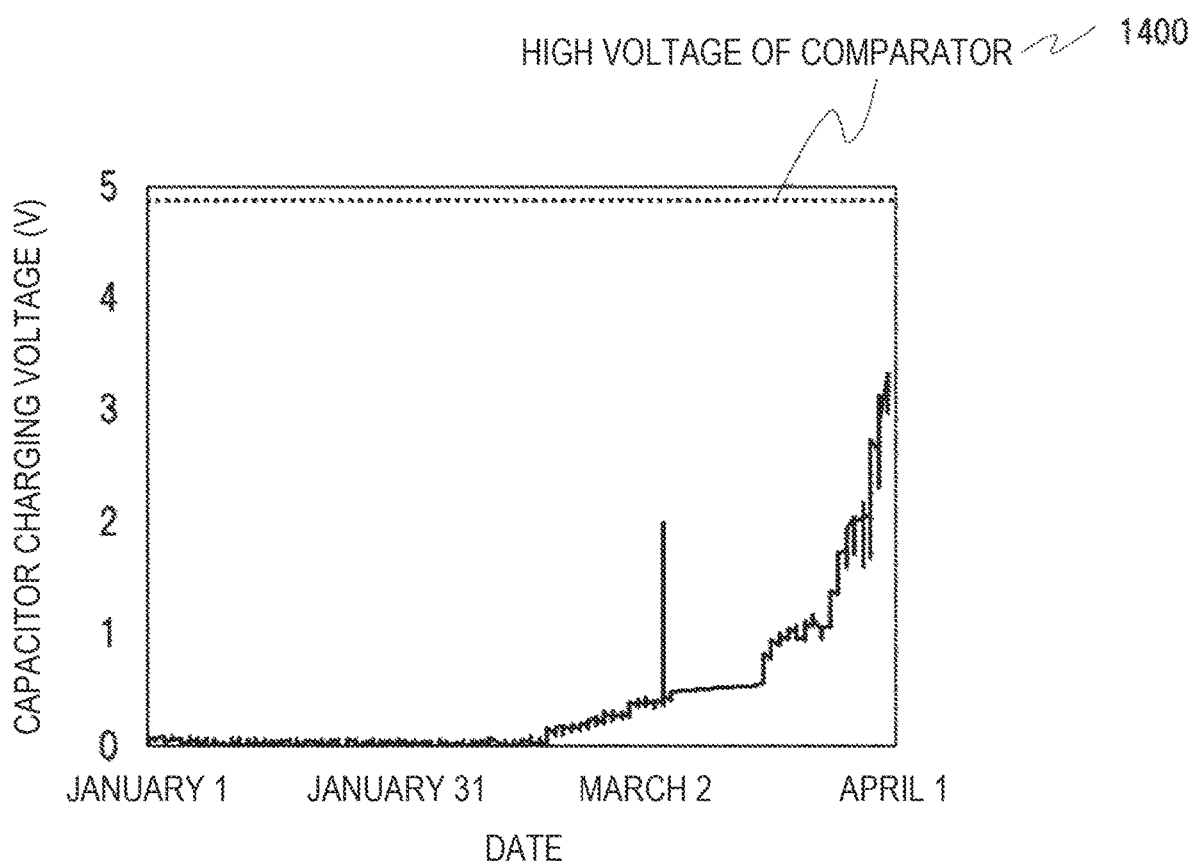
FIG. 15 is a conceptual diagram illustrating a deterioration state diagnosing scheme based on the capacitor charging voltage according to the fourth embodiment.

FIG. 15 is a conceptual diagram of a deterioration state diagnosing scheme which uses a capacitor charging voltage as a deterioration detection index. This diagnosis is performed by a diagnosing unit 707. As the rotator deteriorates, the capacitor charging voltage increases. The capacitor charging voltage transitions from a LOW voltage (which is illustrated as 0 V), and a HIGH voltage (which is illustrated as 5 V) of the comparator. An increase rate of the capacitor charging voltage is equal to the non-normal time rate. Hence, when the non-normal time rate=$T_{th}$(%) is a decision criterion, the non-normal time rate can be converted into the decision threshold of the capacitor charging voltage according to Equation (4).

[Mathematical Formula 4]

$$V_{th} = V_{max}\left(\frac{T_{th}}{100}\right) \quad (4)$$

In this regard, $V_{th}$ represents a decision threshold (V) of a capacitor charging voltage, and $V_{max}$ represents a HIGH voltage of the comparator. In a case of, for example, $T_{th}=40(\%)$, $V_{th}=2$ (V) can be set.

Fifth Embodiment

The first to fourth embodiments have described the examples where a device monitoring personnel (user) of a factory monitors a deterioration state of a device by using a deterioration detecting system. The fifth embodiment will describe an example where a device monitoring personnel (referred to as a vendor below) of a maintenance company at a site different from the factory monitors a deterioration state of the device based on information obtained from a diagnosis device installed in the factory.

Figure 16:
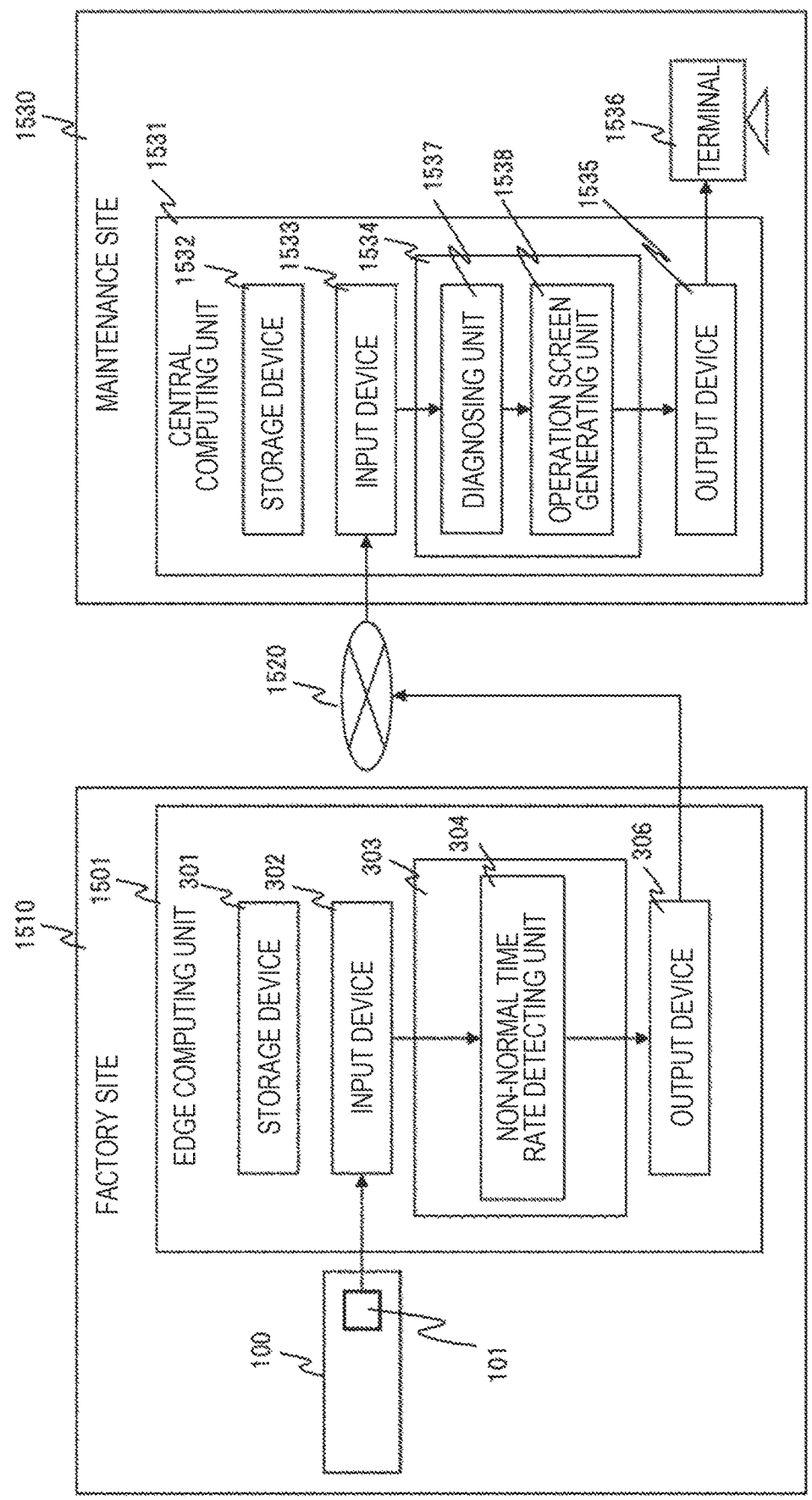
FIG. 16 is a block diagram illustrating a configuration of a deterioration detecting system in a case where a factory and a maintenance site are different according to a fifth embodiment.

FIG. 16 is a block diagram illustrating a configuration of the deterioration detecting system in a case where a factory site including the device and a maintenance site which monitors deterioration are different. A factory site 1510 and a maintenance site 1530 are connected via a network 1520. A vibration sensor 101 is attached to a rotator 100 installed at the factory site 1510, and a sensor signal is transmitted to an edge computing unit 1501. Similarly to a computing unit 300 in FIG. 3, the edge computing unit 1501 can include a storage device 301, an input device 302, a processing device 303 and an output device 306. The processing device 303 includes a non-normal time rate detecting unit 304 as a function. The output device 306 transmits a non-normal time rate detected by the non-normal time rate detecting unit 304 to the maintenance site 1530 via the network 1520. Hence, the output device 306 plays a role of a transmitting unit for the network 1520. This function may be a general network interface.

A central computing unit 1531 can include a storage device 1532, an input device 1533, a processing device 1534 and an output device 1535. The storage device 1532 stores information received from the factory site 1510, and programs executed by the processing device 1534. The input device 1533 receives information from the edge computing unit via the network 1520. The processing device 1534 includes a diagnosing unit 1537 and an operation screen generating unit 1538 as functions. The diagnosing unit 1537 diagnoses a deterioration state of the rotator 100 based on information received from the edge computing unit.

The operation screen generating unit 1538 generates an operation screen displayed on a terminal 1536. In the present embodiment, the operation screen generating unit 1538 assumes an HTML server, and outputs a code described by a language such as JavaScript (registered trademark), Cascading Style Sheets (CSS), PHP, Ruby or Java (registered trademark). The terminal 1536 assumes a tablet device which is a small computer, and assumes that an operation screen is displayed on a web browser.

The central computing unit may not necessarily need to be physically installed at the maintenance site. A cloud server installed at a site different from the maintenance site may play a role of the central computing unit 1531. Furthermore, only part of functions performed by the central computing unit 1531 may be performed by the cloud server. For example, only a function of the storage device 1532 which stores the sensor signal may be performed by an external storage server.

FIG. 16 illustrates an example where the diagnosing unit 1537 is included in the central computing unit 1531. However, the diagnosing unit 1537 may be included in the edge computing unit 1501. In this case, the processing device 303 includes the diagnosing unit 1537 as a function, and the output device 306 outputs a deterioration state diagnosis result instead of the non-normal time rate to the central computing unit.

Sixth Embodiment

An embodiment of an interface by which a device monitoring personnel (vendor) of a maintenance company monitors a device of each factory and which displays a maintenance situation will be described by using the sixth embodiment. The vendor simultaneously monitors one or a plurality of factories, so that it is possible to provide timely repair (or maintenance) to the user according to a device situation.

Figure 17:
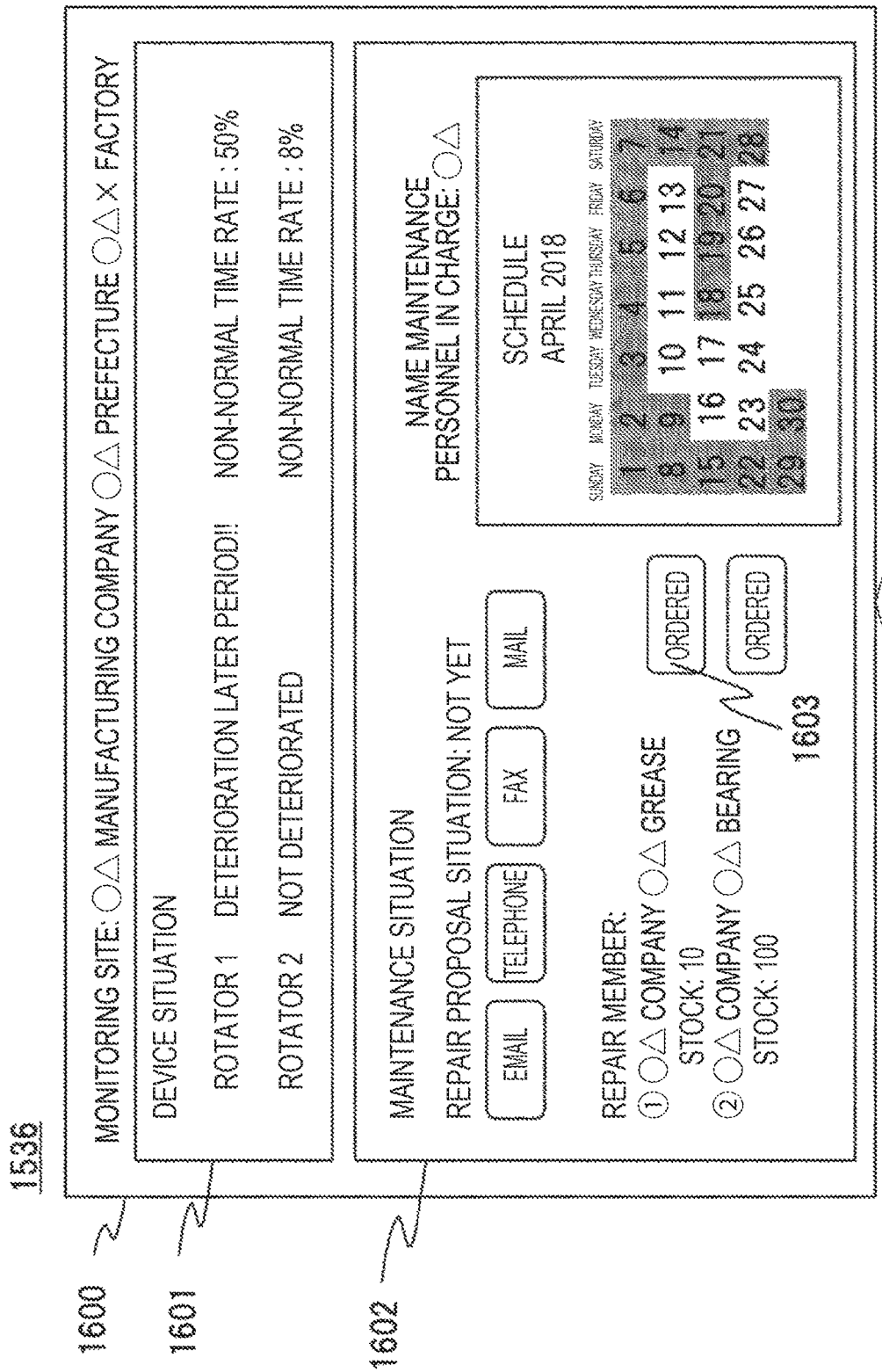
FIG. 17 is a layout chart illustrating an example of a maintenance management monitor displayed on a terminal according to the sixth embodiment.

FIG. 17 is a layout chart illustrating an example of a maintenance management monitor displayed on a terminal 1536. The vendor can learn a device situation and a maintenance situation via a maintenance management monitor 1600 displayed on the terminal 1536 illustrated in FIG. 16. A device situation window 1601 displays a deterioration state of a device and a non-normal time rate.

A maintenance situation window 1602 displays a repair proposal situation. When a vendor pushes an email, telephone, FAX or mail button, a repair proposal contact is transmitted to a user by using each contact means. Furthermore, the maintenance situation window displays a name of a maintenance personnel in charge, and a schedule of a maintenance personnel in charge. The vendor can check the schedule of the maintenance personnel and then transmit the repair proposal contact to the user, so that it is possible to quickly determine a repair date. Furthermore, the maintenance situation window displays the number of repair members in stock. When the vendor pushes an order button 1603, order information is transmitted to each member manufacturer. The vendor can check a device situation and manage a stock of members which are necessary for repair, so that stock management efficiency improves. When, for example, an occurrence of a device failure is detected, it is possible to shorten period until a repair deadline by securing the stock of necessary members in advance. Furthermore, by securing a less stock of the members which are necessary for failures of a low occurrence frequency (e.g., a failure which occurs at a frequency such as once in 10 years), it is possible to reduce an asset owned by a maintenance company and improve a Return On Equity (ROE).

Seventh Embodiment

The above embodiments have described a rotator as an example. However, the present embodiment is applicable to other diagnosis targets, too. For example, an embodiment of diagnosis of a cutting machine will be described. The cutting machine is a device which cuts or grinds a workpiece by using a cutting tool, and is, for example, a drilling machine, a milling machine, a machining center or a Numerically Control (NC) machine.

Figure 18:
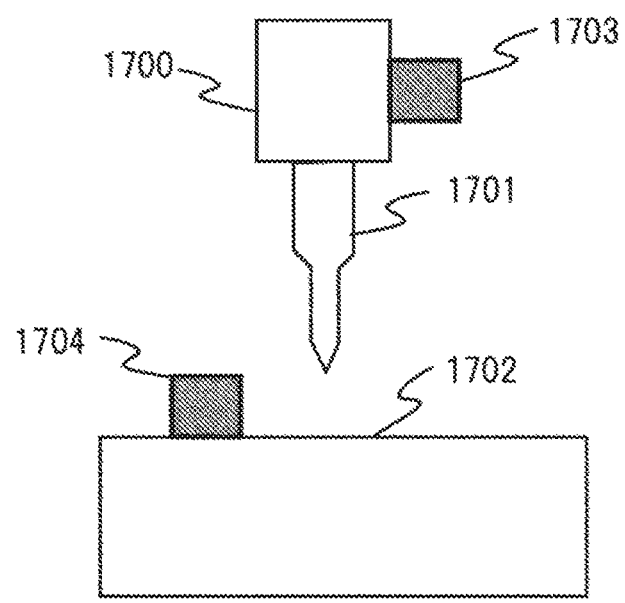
FIG. 18 is a conceptual diagram illustrating a situation that a sensor is mounted on a cutting machine according to a seventh embodiment.

FIG. 18 illustrates an example of a cutting machine as a cutting tool. A drill holding unit 1700 holds a drill 1701. The drill holding unit 1700 rotates the drill 1701 and the drill holding unit 1700 descends to perform a drilling process on a workpiece 1702. To monitor deterioration of the cutting machine, a current sensor 1703 is attached to the drill holding unit 1700. Furthermore, a vibration sensor 1704 is attached to the workpiece 1702 to monitor process accuracy of the drilling process.

A current signal of the drill has a waveform having a frequency component resulting from the rotational speed of the drill and the number of drill bits, and, when the drill deteriorates, a waveform amplitude increases. To detect deterioration by using a conventional current amplitude, a rotational speed setting value of the cutting machine and design drawing information of the drill are necessary. On the other hand, by processing a sensor signal obtained from the current sensor 1703 by a system configuration similar to those of the first to fourth embodiments, it is possible to monitor deterioration of the drill without using the rotational speed setting value and the design drawing information. In this case, the current amplitude before the drill deteriorates may be defined as a normal amplitude, and a deterioration state of the drill has a correlation with a non-normal time rate.

Similarly to drilling process accuracy, too, drill information is necessary to monitor process accuracy by using a conventional vibration amplitude. On the other hand, by performing processing by the system configuration similar to those of the first to fourth embodiments, it is possible to monitor process accuracy without using drill information

What is claimed is:

1. A state detecting system which detects a state of a machine device based on a detection signal from a detecting element provided to the machine device, the state detecting system comprising:
a processor configured to detect a rate or a value as a non-normal time rate, the rate being a rate of an integration value of a time during which an amplitude of the detection signal exceeds a predetermined normal amplitude within a predetermined time, and the value being physically equivalent to the rate,
wherein the processor is further configured to
add a reference signal to the detection signal and to generate a reference addition signal, and
measure a number of times that the reference addition signal crosses a positive value and a negative value within the predetermined time.

2. The state detecting system according to claim 1, wherein a frequency of the reference signal is a frequency which exceeds an upper limit of a frequency component included in the detection signal.

3. The state detecting system according to claim 1, wherein a frequency of the reference signal is variable.

4. The state detecting system according to claim 1, further comprising:
a capacitor which is charged during the time during which the amplitude of the detection signal exceeds the normal amplitude, and
a voltage measuring unit which measures a voltage of the capacitor.

5. The state detecting system according to claim 1, wherein the processor is further configured to diagnose deterioration based on the non-normal time rate.

6. The state detecting system according to claim 5, wherein the processor is further configured to calculate a moving average of the non-normal time rates, and to exclude an unexpected error from the deterioration diagnosis based on the moving average.

7. The state detecting system according to claim 1, further comprising a transmitting unit which transmits the non-normal time rate to a network.

8. The state detecting system according to claim 1, further comprising a storage unit which stores the amplitude calculated based on the detection signal at a certain point of time as the normal amplitude.

9. A state detecting method for detecting a state of a machine device based on a detection signal obtained from a detecting element provided to the machine device, wherein the state detecting method comprises:
detecting, by an information processing device or hardware including an input device, a storage device, a processing device and an output device,
a rate or a value as a non-normal time rate, the rate being a rate of an integration value of a time during which an amplitude of the detection signal exceeds a predetermined normal amplitude within a predetermined time, and the value being physically equivalent to the rate;
generating a reference signal;
adding the reference signal to the detection signal and generating a reference addition signal, and
measuring a number of times that the reference addition signal crosses a positive value and a negative value within the predetermined time.

10. The state detecting method according to claim 9, wherein
the hardware includes a capacitor,
the capacitor is charged during the time during which the amplitude of the detection signal exceeds the predetermined normal amplitude within the predetermined time, and
a voltage of the capacitor at an end of the predetermined time is measured.

\* \* \* \* \*